(12) United States Patent
Swift et al.

(10) Patent No.: US 6,847,548 B2
(45) Date of Patent: Jan. 25, 2005

(54) MEMORY WITH MULTIPLE STATE CELLS AND SENSING METHOD

(75) Inventors: Craig T. Swift, Austin, TX (US); Michael A. Sadd, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

(21) Appl. No.: 10/601,256

(22) Filed: Jun. 20, 2003

(65) Prior Publication Data

US 2004/0257871 A1 Dec. 23, 2004

(51) Int. Cl.$^7$ .............................................. G11C 11/34
(52) U.S. Cl. ...................... 365/174; 365/131; 365/168; 365/187
(58) Field of Search ........................... 365/174, 94, 104, 365/187, 188, 131, 168, 185.03

(56) References Cited

U.S. PATENT DOCUMENTS

| | | | |
|---|---|---|---|
| 5,742,540 A | * | 4/1998 | Wakasugi et al. ............ 365/104 |
| 6,011,725 A | | 1/2000 | Eitan ..................... 365/185.33 |
| 6,181,597 B1 | | 1/2001 | Nachumovsky .......... 365/185.3 |
| 6,778,419 B2 | * | 8/2004 | Barry et al. ................... 365/94 |
| 2002/0037595 A1 | | 3/2002 | Hosotani ........................ 238/3 |

OTHER PUBLICATIONS

Eitan, Boaz et al.; A Novel Localized Trapping, 2–Bit Nonvolatile Memory Cell; IEEE Electron Device Letters; Nov., 2002; pp. 543–545; vol. 21; No. 11;IEEE.

* cited by examiner

*Primary Examiner*—Tan T. Nguyen
(74) *Attorney, Agent, or Firm*—Robert L. King; James L. Clingan, Jr.

(57) ABSTRACT

A memory has an array made up of transistors that have two charge storage regions between the channel and control gate. Each bit is made up of two charge storage regions that are from different transistors. A bit is written by first erasing all of the storage locations and then writing one of the charge storage locations that make up the bit. A pair of charge storage locations, one erased and the other programmed, is identified for each bit. The logic state of the bit is read by comparing the charge stored in the two charge storage locations that make up the bit. This comparison is achieved by generating signals representative of the charge present in the two charge storage locations. These signals are then coupled to a sense amplifier that functions as a comparator. This avoids many problems that accompany comparisons to a fixed reference.

30 Claims, 3 Drawing Sheets

MEMORY WITH MULTIPLE STATE CELLS AND SENSING METHOD

FIELD OF THE INVENTION

This invention relates generally to semiconductor memories, and more specifically, to nonvolatile memories having memory cells with multiple states.

BACKGROUND OF THE INVENTION

As bits are programmed and erased in a nonvolatile memory array, the threshold voltage levels required to program and erase the memory cells shift due to electrical charge that cannot be erased being trapped in the gate structure above the channel region of the transistors forming the memory cells. This threshold voltage shift causes memory lifetime problems with reading the memory because a fixed reference voltage level is typically used in association with sensing (read) the memory. Examples of such a memory include nonvolatile memories such as nanocrystal memories, nitride memories and traditional floating gate nonvolatile memories. The operation of these memories is well documented in the literature and will not be described in detail herein.

For nitride and nanocrystal memories, electron charge accumulates in the gate structure that affects the channel's electrical characteristics. Shown in FIG. 1 is a graph that indicates a shift in the program threshold voltage and the erase threshold voltage due to the electron charge accumulation. As the number of memory program and erase cycles increases over the life of the memory, the accumulation of gate structure charge causes both the erase threshold voltage and the program threshold voltage to rise. Although the difference between the erase voltage and the program voltage may remain relatively the same over the life of the memory, the accumulation of charge results in a premature failure of the memory. A reference voltage, labeled "Reference", is typically used to sense or read the memory. Whenever the erase threshold voltage exceeds this reference at a point in time 1, the memory can no longer be reliably read because the erase threshold voltage appears to be a program threshold voltage. The number of cycles at which this error may occur is variable and unpredictable.

Another failure issue associated with nitride and nanocrystal memories is the change in the value of the erase threshold voltage and the program threshold voltage as a function of time. Initially, nitride or nanocrystal memories have a relatively low erase threshold voltage and a higher program threshold voltage that differs by a predetermined amount. Between the program threshold voltage and the erase threshold voltage is a reference voltage that is used in a compare operation to sense or read the memory. As time proceeds, charge leakage from the gate structure of the transistors in the memory cells results in the program voltage decreasing as shown in the graph of FIG. 2. Also as time elapses, the erase threshold voltage of the memory increases due to one of several factors. Such factors include, for example, a phenomena known as 'read disturb' and/or 'program disturb' in which charge is added to the storage region of each memory cell. Another factor is caused by the loss of net positive charge in the storage region. As shown in FIG. 2, when the program threshold voltage declines to the value of the reference voltage at a point in time 2, operation of the memory becomes faulty because it is no longer possible to distinguish a program state from an erase state. Therefore, known nitride and nanocrystal memories have a finite operational life limited in time.

U.S. Pat. No. 6,011,725 entitled "Two Bit Non-Volatile Electrically Erasable and Programmable Semiconductor Memory Cell Utilizing Asymmetrical Charge Trapping" by Eitan discloses a nitride memory with a single transistor having the capability of storing two bits by using asymmetrical charge trapping. The two bits are read from the transistor by comparing each bit with a reference voltage. Each bit is accessed from the transistor cell by switching the direction of current flow through the transistor. However, the memory is susceptible to the problem of the declining differential between the program threshold voltage and the erase threshold voltage and the increase of the erase threshold voltage above a reference voltage. Yet a further example of a nitride memory with a two-bit cell that is read by using a reference voltage is described in U.S. Pat. No. 6,181,597 entitled "EEPROM Array Using 2-Bit Non-Volatile Memory Cells With Serial Read Operations" by Nachumovsky. These memories are generally limited in useful life as a function of both time and the number of program/erase cycles.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
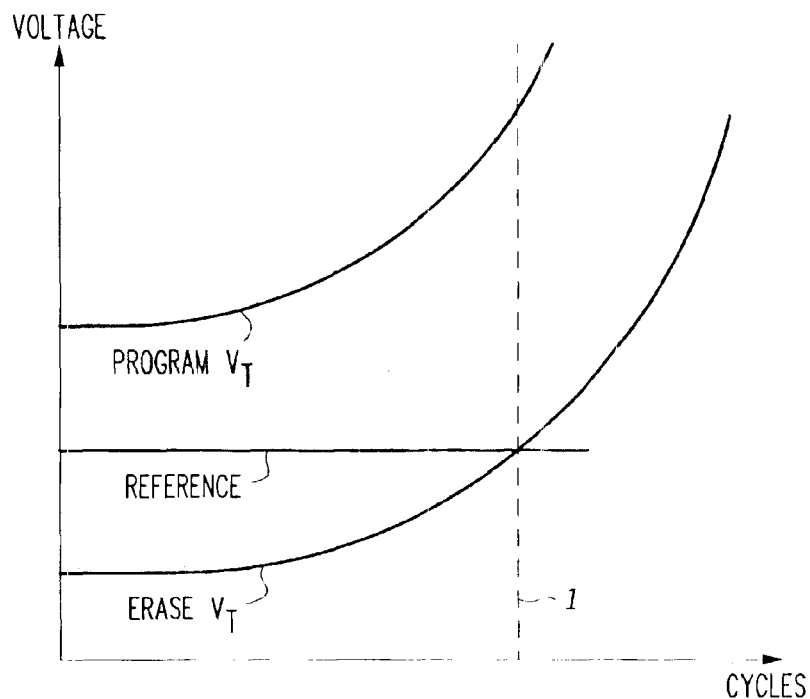
FIG. 1 illustrates a known graph of a relationship between program and erase threshold voltages as a function of program and erase cycles for a memory.
Figure 2:
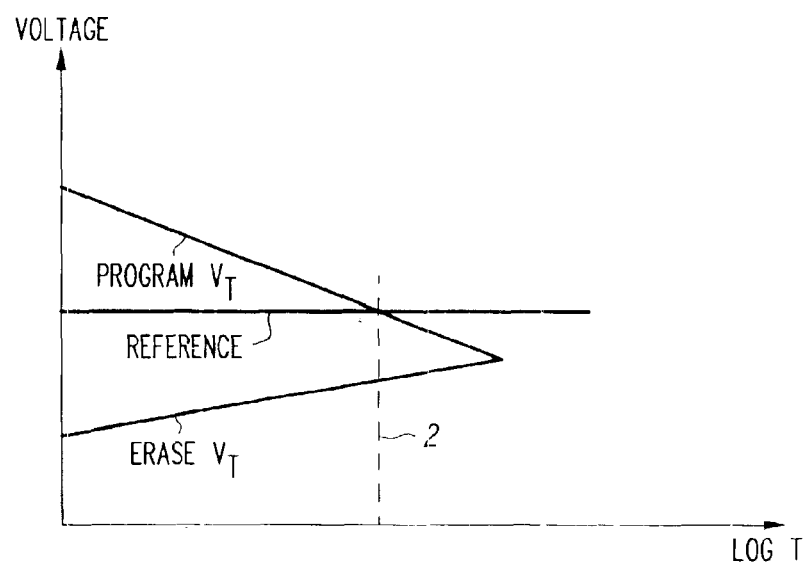
FIG. 2 illustrates a known graph of a relationship between program and erase threshold voltages as a function of time.
Figure 3:
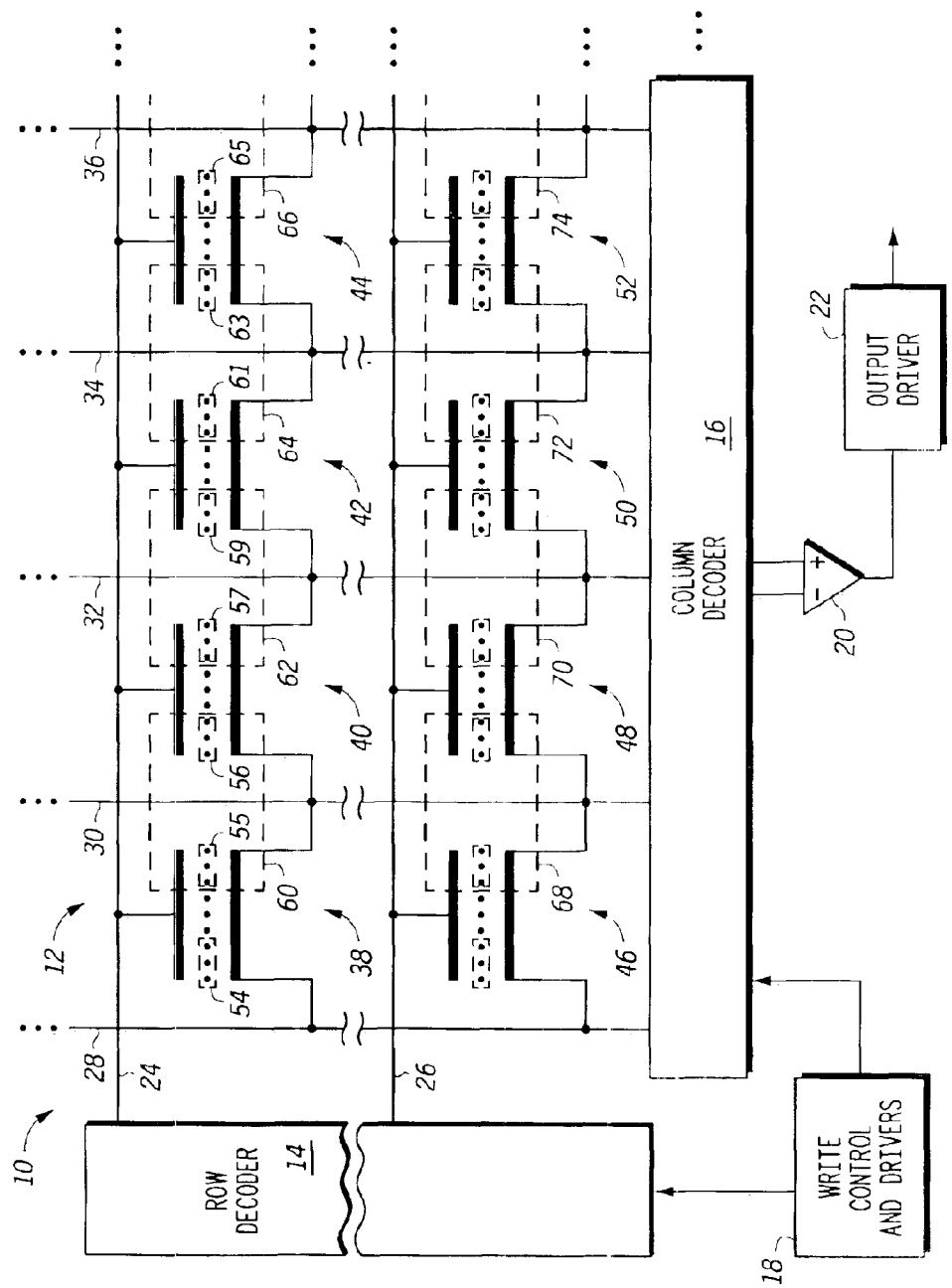
FIG. 3 illustrates a memory architecture in accordance with the present invention having memory cells with two states in each cell.

Illustrated in FIG. 3 is a memory 10 in accordance with the present invention. Memory 10 generally has an array 12, a row decoder 14, a column decoder 16, a write circuit or a write control and drivers 18, a sense amplifier 20 having complementary inputs and an output driver 22. Within the array 12 are placed a plurality of word lines, such as word line 24 and word line 26, and a plurality of bit lines, such as bit line 28, bit line 30, bit line 32, bit line 34 and bit line 36. Also within array 12 is a plurality of transistors, such as transistor 38, transistor 40, transistor 42, transistor 44, transistor 46, transistor 48, transistor 50 and transistor 52. Each of transistors 38, 40, 42 and 44 has a control gate connected to word line 24. Beneath the control gate of these transistors and in the bulk thereof is a channel region. Each of transistors 46, 48, 50 and 52 has a control gate connected to word line 26. Similarly, beneath the control gate of these transistors and in the bulk thereof is a channel region. Transistor 38 and transistor 46 each have a first current electrode connected to bit line 28. The first current electrode functions as either a source or a drain depending upon the bit line voltages. Each of transistor 38 and transistor 46 has a second current electrode connected to bit line 30. Each of transistors 40 and 48 has a first current electrode connected to the bit line 30. Each of transistors 40 and 48 has a second current electrode connected to the bit line 32. Each of transistors 42 and 50 has a first current electrode connected to the bit line 32, and each of transistors 42 and 50 has a second current electrode connected to the bit line 34. Each of transistors 44 and 52 has a first current electrode connected to the bit line 34, and each of transistors 44 and 52 has a second current electrode connected to bit line 36. Each of bit lines 28, 30, 32, 34 and 36 is connected to a respective input/output of column decoder 16. Each of word lines 24 and 26 is connected to a respective output of row decoder 14. The write control and drivers 18 have outputs respectively connected to the row decoder 14 and column decoder 16. The array 12 contains any number of additional rows and columns of memory cells, bit lines and word lines as indicated with the section breaks and dots. Within each of transistors 38, 40, 42, 44, 46, 48, 50 and 52 is a layer of storage material, such as for example nanoclusters, silicon nanocrystals or silicon nitride. It should also be noted that in an alternative form the storage layer may also be implemented as a physically discontinuous layer. Within the layer of storage material of each transistor are two charge storage regions having charge storage material, such as charge storage regions 54 and 55 of transistor 38. Transistor 40 has charge storage regions 56 and 57. Transistor 42 has charge storage regions 59 and 61. Transistor 44 has charge storage regions 63 and 65. Similarly, transistors 46, 48, 50 and 52 each have two charge storage regions (not numbered). However, by grouping charge storage regions of the transistors so that complementary charge states are paired into two sub-portions of two memory cells, an efficient memory may be provided that extends the useful life as compared with previous nonvolatile memories. As used herein, the term 'complementary' means an opposite value, such as opposite charge state (positive/negative) or charged/uncharged. Charge storage regions 55 and 56 of transistors 38 and 40, respectively, form bit 60 in the form of the bit value and its complement. Similarly, charge storage regions 57 and 59 of transistors 40 and 42, respectively, form bit 62. Charge storage regions 61 and 63 of transistors 42 and 44, respectively, form bit 64. Charge storage region 65 and a charge storage region not shown form a bit 66. Charge storage regions 68, 70, 72 and 74 are illustrated in connection with transistors 46, 48, 50 and 52, respectively. Differential outputs of column decoder 16 are connected to sense amplifier 20 having a first input or a positive input and a second input or a negative input. An output of sense amplifier 20 is connected to an input of an output driver 22 that provides the logic state output value.

In operation, memory 10 is an array of memory cells for storing a plurality of bits wherein each memory cell is a transistor, such as transistor 40, having two storage regions, such as charge storage regions 56 and 57. Each of the plurality of bits, such as bit 62, is stored as complementary charge states in two of the charge storage regions from different memory cells. Assume that initially a bulk erase operation of the array 12 is performed. There are several methods that may be implemented to perform a bulk erase of memory 10. By way of example only, the use of uniform Fowler-Nordheim tunneling may be implemented to remove charge from each charge storage region. Other conventional erase mechanisms may include hot hole injection (HHI) or others may be used. Prior to a bulk erase operation, all previously erased bits are typically first programmed to ensure uniform use of the memory.

The programming of memory 10 is performed by delivering a memory address to the row decoder 14 and the column decoder 16. In response, a predetermined row and column is selected. Assume that bit 62 is addressed for writing. To write to bit 62, a program of one or the other of charge storage region 57 or charge storage region 59 must be implemented. In other words, the write circuit of write control and drivers 18 writes a first logic state by forming a first charge state in a first storage region of a first transistor and a second charge state different from the first charge state in a second storage region of a second transistor. Assuming that both charge storage region 57 and charge storage region 59 of bit 62 are initially erased, the write operation only requires charge storage region 57 to be programmed while charge storage region 59 remains erased, or vise versa depending on the data to be stored. The transistors do not necessarily have to be contiguous. For the example of writing charge storage region 57, bit line 30 is held at a ground potential, bit line 32 is raised to a first programming potential and word line 24 is raised to a second programming potential. If only charge storage region 57 is being programmed, bit line 28 is also grounded to prevent inadvertent programming of charge storage region 54 within transistor 38. Word line 26 is typically held at a ground reference potential. Bit lines 34 and 36 are held at the first programming potential if charge storage region 57 is the only memory cell being programmed. These potentials are held for a predetermined amount of time to allow electrons to be introduced into charge storage region 57 until an appropriate amount of charge is accumulated. At that point, all programming potentials are removed. Remaining memory cells are similarly programmed. Other mechanisms, such as band-to-band tunneling, may be used to program the memory cells. This discussion is applicable to a hot carrier programming technique. If other programming techniques are used, other program steps would be used. If multiple bits are being simultaneously programmed, then additional bit lines would be raised or lowered depending upon the bit value to be programmed.

Figure 4:
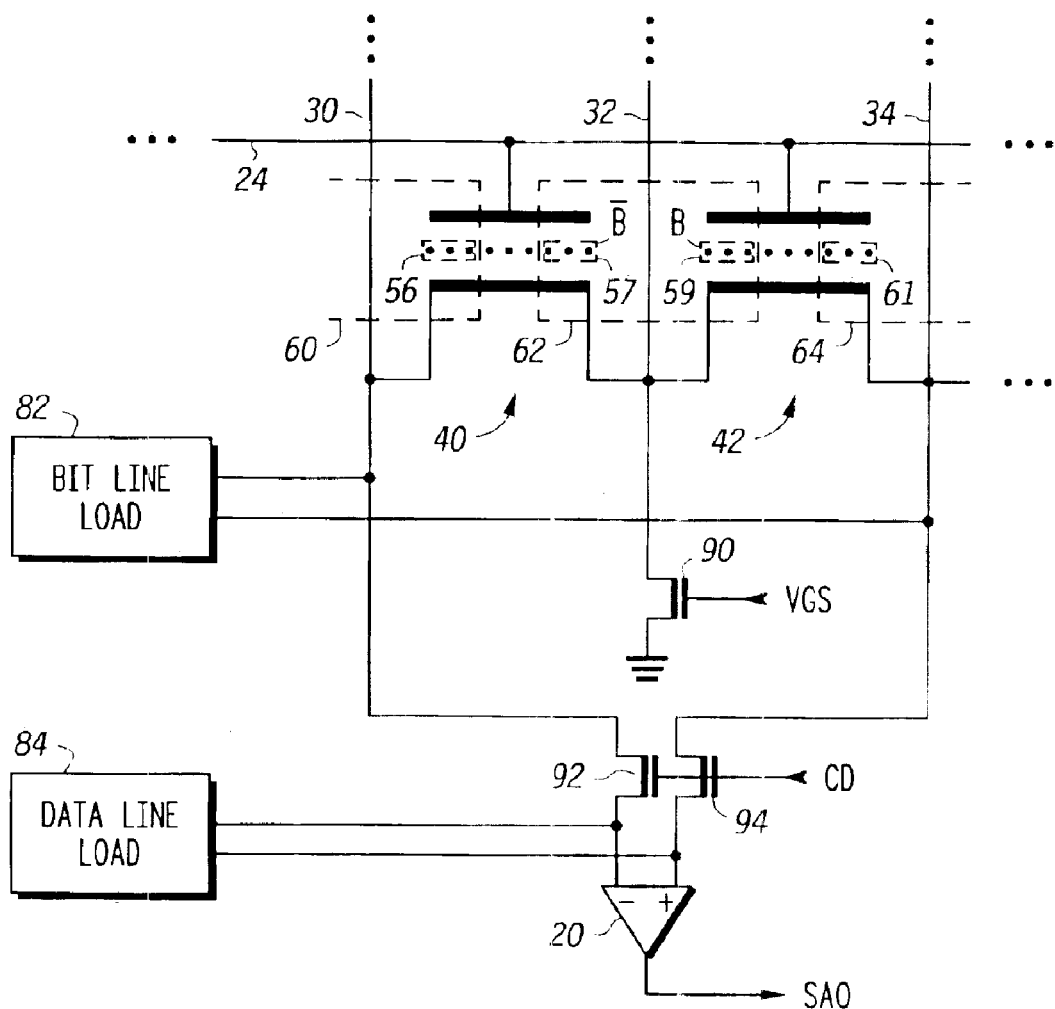
FIG. 4 illustrates in further detail a portion of the memory architecture of FIG. 3.

Illustrated in FIG. 4 is a further detail of transistors 40 and 42 of memory 10 of FIG. 3. For purposes of explanation, elements that are common between FIG. 3 and FIG. 4 are provided with the same reference number in FIG. 3. A bit line load circuit 82 is connected to bit line 30 and bit line 34. In one form, the bit line load circuit 82 is a current source having a resistive device connected to a positive power supply voltage. An N-channel transistor 90 has a drain connected to bit line 32, a gate connected to a virtual ground select (VGS) signal supplied by column decoder 16, and a source connected to a ground reference terminal. An N-channel transistor 92 has a drain connected to bit line 30, a control gate connected to a column decode (CD) signal provided by column decoder 16, and a source connected to a negative input of sense amplifier 20. An N-channel transistor 94 has a drain connected to bit line 34, a control gate connected to the column decode (CD) signal, and a source connected to the positive input of sense amplifier 20. An output of sense amplifier 20 provides a sense amplifier output (SAO) signal. The SAO signal is at a logic state that is representative of a difference received at the complementary (positive and negative) inputs of sense amplifier 20. A data line load circuit 84 has a first output connected to the source of transistor 92 and a second output connected to the source of transistor 94.

Once data has been written to memory 10, it is subsequently desired to be read. By way of example, a read operation of memory bit 62 will be described. Bit line 32 is grounded by means of transistor 90 becoming conductive in response to the signal VGS (virtual ground select) supplied by column decoder 16. A potential is placed on bit lines 30 and 34 by means of the bit line load circuit 82 such that the influences of the charge storage regions 56 and 61 are eliminated. Depletion regions extending below charge storage regions 56 and 61 eliminate the influence of those charge storage regions on transistors 40 and 42, respectively. This elimination of influence results in charge storage region 57 controlling the conductivity of transistor 40 assuming that an appropriate control gate bias exists on word line 24. Similarly, this elimination of influence results in charge storage region 59 controlling the conductivity of transistor 42 assuming that an appropriate control gate bias exists on word line 24. Word line 24 would start at as low a potential as possible and rise only high enough to turn on the transistor 40 or 42 having the lowest voltage threshold as dictated by the charge storage regions 57 and 59, respectively. This technique compensates for drift of the value of the program and erase threshold voltages during the life of the memory 10.

As described above in connection with FIG. 3, if charge storage region 57 is programmed to a charge state corresponding to a high program threshold voltage, then charge storage region 59 will accordingly be left in a complementary charge state corresponding to the erased threshold voltage. As the voltage on word line 24 is raised during the read operation, transistor 42 will be conductive before transistor 40 is conductive. Hence, current will flow from bit line 34 to ground through bit line 32 which tends to lower the voltage potential of bit line 34. The potential difference between bit lines 34 and 30 is sensed in sense amplifier 20 through transistors 92 and 94 in response to the column decode (CD) signal provided by column decoder 16. Bit line 30 generates a first signal that is representative of charge stored in charge storage region 57, and bit line 34 generates a second signal that is representative of charge stored in charge storage region 59. Sense amplifier 20 provides a Sense Amplifier Output (SAO) signal corresponding to a logic value of zero or one. It should be apparent that various sense amplifier schemes and circuits may be used to perform this comparison function. Either voltage sensing or current sensing may be implemented.

The differential reading technique of memory 10 allows for increased reliability for a nonvolatile memory. Traditional memories utilizing a sense amplifier with a fixed reference voltage do not tolerate a varying program and erase threshold voltage. To extend the life of such memories, a reference voltage magnitude must be chosen to be sufficient near the end of life of the memory. This higher voltage magnitude results in a high gate voltage for the memory that stresses the memory. In contrast, in memory 10 the control gate voltage is reduced and is significantly lower in the earlier part of the life of the memory 10. As a result of using a lower control gate voltage, memory 10 saves power and decreases the read access time. Additionally memory 10 decreases word line precharge time due to lower voltage operation. Memory 10 minimizes a read disturbance due to the lower voltage operation that creates a lower electrical field. Because memory 10 uses a differential read operation, memory 10 is optimized to use a minimal difference between the program threshold voltage and the erase threshold voltage so that one transistor cell turns on before the other. The memory does not have to account for a fixed reference level to be maintained between program and erase threshold voltages. Therefore, the difference between program and erase threshold voltages is allowed to become very small thus extending the useful life of the memory array. Traditionally, a differential read operation requires two transistors per memory bit, wherein a first transistor provided a charge state and a second transistor provided a complementary charge state. In contrast, because each transistor of memory 10 has two charge storage regions, memory 10 enables a differential read operation with the same number of transistors as bits. This results in significantly reduced memory size wherein the bit area is one-half of traditional differentially read memories.

By now it should be appreciated that there has been provided an improved NVM and method that requires less area than traditional differential read memories, less power and has longer operational life. Memory 10 uses a differential sensing method that requires two charge storage regions, one programmed and one remaining erased (always opposite states). In this manner the current resulting from a programmed charge storage region is compared to the current resulting from an erased charge storage region that is subject to similar influences such as charge trapping, data retention, etc. This differential comparison maximizes the ability to decipher a programmed state from an erased state.

In the foregoing specification, the invention has been described with reference to specific embodiments. However, one of ordinary skill in the art appreciates that various modifications and changes can be made without departing from the scope of the present invention as set forth in the claims below. For example, various charge storage regions may be used. The regions could be separate regions within a continuous but insulating storage film, such as silicon nitride. The charge storage regions may be two electrically isolated conductors. Further, the two charge storage regions making up a bit may also be placed in other locations within a same memory row. The present invention is not limited to any particular type of sense amplifier, row and column decode circuitry or control and driver circuits. The sense amplifier may be a comparator, a current comparator or a voltage comparator. Various charge storage materials may be used such as any type of material suitable for forming nanoclusters. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A memory comprising an array of memory cells for storing a plurality of bits, wherein each memory cell is a transistor having two storage regions, each bit of the plurality of bits is stored as complementary charge states in two storage regions, and the two storage regions being from different memory cells.

2. The memory of claim 1 further comprising a sense amplifier having complementary inputs for being coupled to the memory cells having the two storage regions.

3. The memory of claim 2 wherein the sense amplifier is for providing an output at a logic state that is representative of a difference received at the complementary inputs.

4. The memory of claim 2 wherein sense amplifier operates as a comparator of the complementary inputs.

5. The memory of claim 4 wherein the sense amplifier compares current.

6. The memory of claim 4 wherein the sense amplifier compares voltage.

7. The memory of claim 1 wherein each of the two storage regions is further characterized as nanocrystals located between a channel and a control gate of one transistor of a plurality of transistors that comprise the array of memory cells.

8. The memory of claim 7 wherein the nanocrystals comprise silicon.

9. The memory of claim 1 wherein the two storage regions are further characterized as areas of charge storage material located between a channel and a control gate of each of a plurality of transistors that comprise the array of memory cells.

10. The memory of claim 1 further comprising write means for writing a selected bit of the plurality of bits to a first logic state into a selected pair of memory cells by erasing all charge storage regions of all of the memory cells, then programming one of the charge storage regions of one of the selected pair of memory cells.

11. A memory, comprising:
a plurality of memory cells, comprising
a first transistor having a channel region, a control gate, a first current electrode, a first storage region between the channel region and the control gate, and a second storage region between the channel region and the control gate; and
a second transistor having a channel region, a control gate, a first current electrode, a first storage region between the channel region and the control gate, and a second storage region between the channel region and the control gate;
a write circuit, coupled to the first and second transistors, for writing a first logic state by forming a first charge state in the first storage region of the first transistor and a second charge state, which is different from the first charge state, in the first storage region of the second transistor; and
a sense amplifier having a first input coupled to the first current electrode of the first transistor and a second input coupled to the first current electrode of the second transistor.

12. The memory of claim 11 wherein the sense amplifier is a comparator.

13. The memory of claim 12 wherein the comparator is a current comparator.

14. The memory of claim 12 wherein the comparator is a voltage comparator.

15. The memory of claim 11 wherein the write circuit is further characterized as writing the first charge state to the first storage region of the first transistor by erasing the first storage region and the second storage region of the first transistor and second transistor and writing the second charge state to the first storage region of the second transistor by providing charge to the first storage-region of the second transistor.

16. The memory of claim 15 wherein the write circuit is further characterized as writing the first storage region and second storage region of the first transistor and second transistor to the second charge state region prior to erasing the first storage region and second storage region of the first transistor and second transistor.

17. The memory of claim 11 wherein the first storage region and second storage region of the first transistor and second transistor comprise nanocrystals.

18. The memory of claim 11 wherein the first transistor and second transistor are further characterized as having second current electrodes that are coupled to each other.

19. A method of operating a memory having a plurality of bits, comprising:
providing an array of memory cells for the memory, wherein each memory cell comprises a transistor having two storage regions;
erasing the two storage regions of the memory cells;
selecting a first memory cell and a second memory cell of the array of memory cells for programming a first bit of the plurality of bits of the memory;
programming the first bit by writing a first storage region of the two storage regions of a first transistor while keeping a first storage region of the two storage regions of a second transistor erased;
generating a first signal that is representative of charge stored in first storage region of the first transistor, and a second signal that is representative of charge stored in the first storage region of the second transistor; and
comparing the first signal to the second signal to determine a logic state of the first bit.

20. The method of claim 19 further comprising implementing the two storage regions of the first transistor and the second transistor with nanocrystals of silicon.

21. The method of claim 19 wherein the two storage regions of the first transistor and the second transistor comprise storage material capable of storing charge between a channel and a control electrode of each of the first transistor and the second transistor.

22. The method of claim 19 wherein the comparing is achieved by comparing current.

23. The method of claim 19 wherein the comparing is achieved by comparing voltage.

24. A method of operating a memory having a plurality of bits, comprising:
providing an array of memory cells for the memory, wherein each memory cell comprises a transistor having a first storage region and a second storage region between a channel and a control gate;
generating a first signal that is representative of charge stored in the first storage region of a first transistor, and a second signal that is representative of charge stored in the first storage region of a second transistor; and
comparing the first signal to the second signal to determine a logic state of a first bit of the plurality of bits.

25. A method of operating a memory having a plurality of bits, comprising:
providing an array of transistors, wherein each transistor has a first storage region and a second storage region;
comparing charge stored in the first storage region of a first transistor to charge stored in the first storage region of a second transistor to determine a logic state of a first bit of the plurality of bits; and
comparing charge stored in the first storage region of a third transistor to charge stored in the first storage region of a fourth transistor to determine a logic state of a second bit of the plurality of bits.

26. The method of claim 25 further comprising implementing the first storage region and the second storage region with nanocrystals.

27. The method of claim 25 further comprising implementing the first storage region and the second storage region with a storage material capable of storing charge between a channel and a control electrode of each transistor.

28. The method of claim 25 wherein the comparing charge stored in the first storage region of a first transistor to charge stored in the first storage region of a second transistor further comprises:

generating a first signal that is representative of charge stored in the first storage region of the first transistor, and generating a second signal that is representative of charge stored in the first storage region of the second transistor; and comparing the first signal to the second signal to determine the logic state of the first bit.

29. The method of claim 28 wherein the comparing the first signal to the second signal is achieved by comparing voltage.

30. The method of claim 28 wherein the comparing the first signal to the second signal is achieved by comparing current.

* * * * *